United States Patent [19]

Johnson, Sr.

[11] 4,065,727

[45] Dec. 27, 1977

[54] VARIABLE FREQUENCY OSCILLATOR HAVING PROGRAMMABLE DIGITAL FREQUENCY DISPLAY

[76] Inventor: William Glen Johnson, Sr., 1251 Hiawatha St., Stockton, Calif. 95205

[21] Appl. No.: 728,518

[22] Filed: Oct. 1, 1976

[51] Int. Cl.² .......................................... H03B 19/12
[52] U.S. Cl. ...................................... 331/51; 325/455; 331/64; 331/116 R; 331/117 R; 331/177 V
[58] Field of Search ................. 331/51, 64, 36 C, 177; 324/78 D; 334/86, 87; 325/455

[56] References Cited

U.S. PATENT DOCUMENTS

| | | | |
|---|---|---|---|
| 3,137,824 | 6/1964 | Kagan et al. | 331/177 V |
| 3,244,983 | 4/1966 | Ertman | 325/455 |
| 3,509,484 | 4/1970 | Basse | 331/64 |
| 3,681,707 | 8/1972 | Bean | 331/64 |
| 3,753,119 | 8/1973 | Close | 331/64 |
| 3,755,763 | 8/1973 | Hoshi | 325/455 |
| 3,835,424 | 9/1974 | Marik | 334/87 |
| 3,983,491 | 9/1976 | Yoshisato | 325/455 |

*Primary Examiner*—John Kominski
*Attorney, Agent, or Firm*—David B. Harrison

[57] ABSTRACT

A high frequency variable oscillator has its frequency grossly set by a bandswitch and an uncalibrated coarse tuning control and finely tuned by an uncalibrated incremental control. The oscillator includes a broad band buffer circuit and a push-pull output circuit to provide an amplified isolated output having attenuated even harmonics. The oscillator includes a user programmable digital counter element connected to count the output of the oscillator. The counter includes timing circuitry and a multiple stage programmable ripple counter timed thereby. Each stage of the counter is connected to a latch decoder which is in turn connected to a digit display element. The latch decoders are connected to be controlled by the timing circuitry.

10 Claims, 8 Drawing Figures

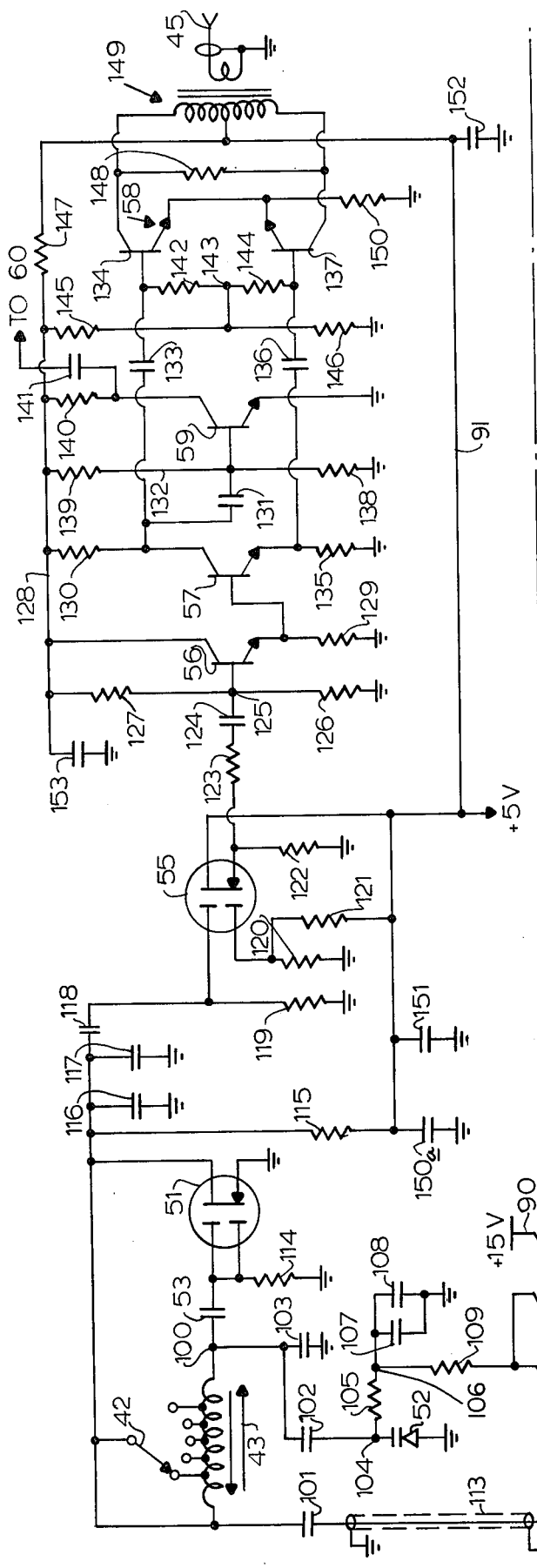
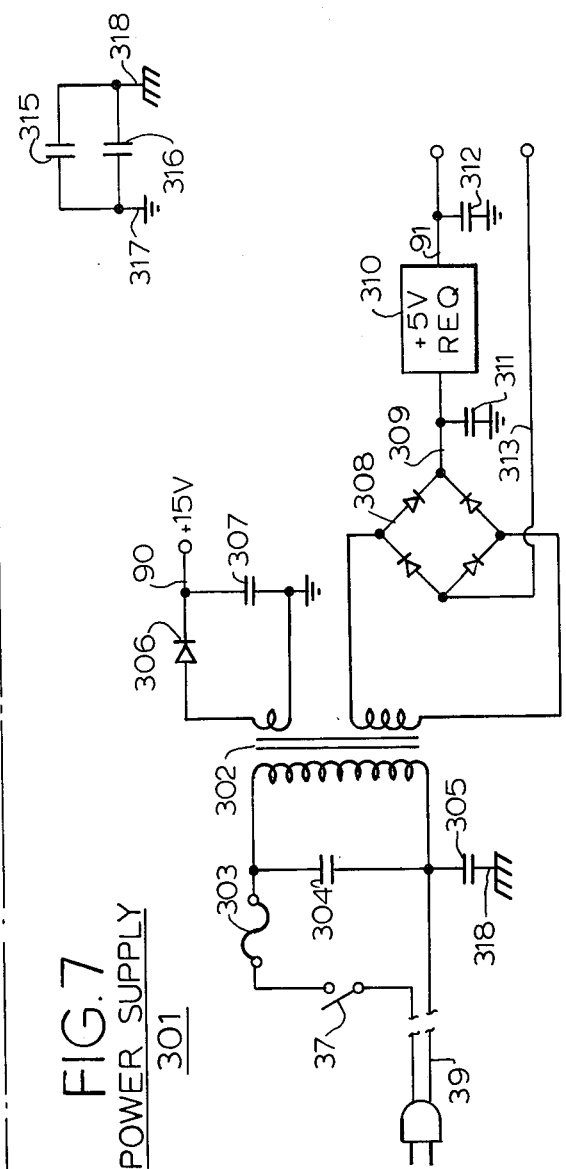
FIG.7 POWER SUPPLY 301
FIG.4 VARIABLE FREQUENCY OSCILLATOR SECTION 48

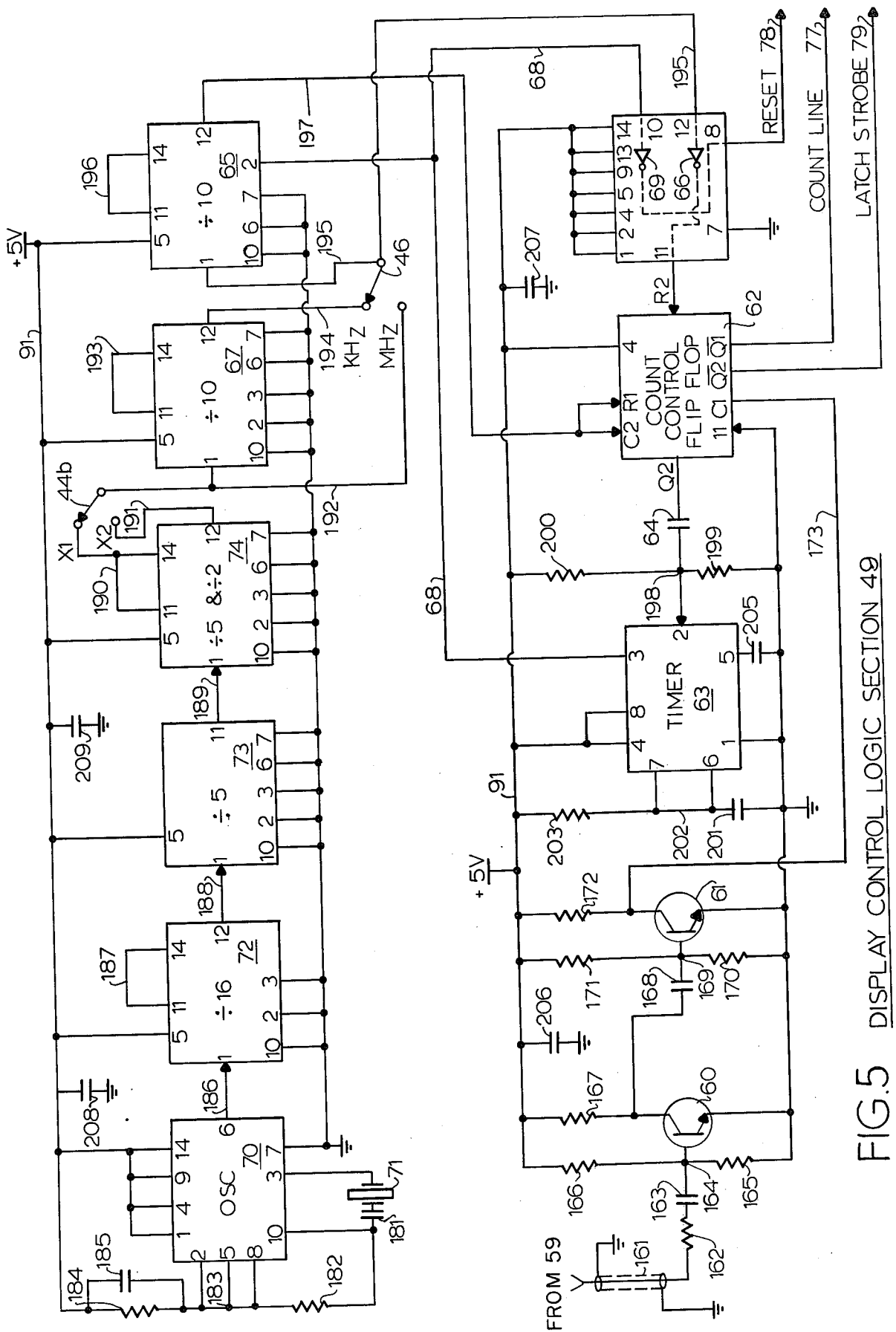
FIG.5 DISPLAY CONTROL LOGIC SECTION 49

VARIABLE FREQUENCY OSCILLATOR HAVING PROGRAMMABLE DIGITAL FREQUENCY DISPLAY

BACKGROUND OF THE INVENTION

This invention relates to an improved variable frequency oscillator. More specifically the present invention relates to a variable frequency oscillator in the high frequency spectrum having continuously variable incremental fine tuning and a presettable digital display of output frequency.

Variable frequency oscillators are well known in radio electronics. Such oscillators have typically been constructed of an amplifier element and a resonant circuit element with a positive feedback path provided from an amplifier output to input thereby inducing the amplifier to oscillate at the resonant frequency of the tank circuit. In radio communication applications, the frequency of such oscillators was typically set by mechanical adjustment of a tuning capacitor or inductor. More recently, variable frequency oscillators have been tuned to a predesired frequency by varying the voltage applied to a varactor diode functioning as a voltage controlled capacitor in the tank circuit of the oscillator.

In many cases, the frequency of the variable frequency oscillator has been indicated by graduations on a scale mechanically linked to the tuning element whether capacitor or inductor. In other instances a digital frequency counter has been connected to the variable frequency oscillator or at other points of the circuitry of the communications equipment, to provide a digital indication of operating frequency. Typically, a digital frequency counter was connected as an accessory to the communications equipment having a variable frequency oscillator as a part thereof, and the frequency calibrations of the communications equipment were duplicated, albeit generally more accurately, by the visual digital indications of the frequency counter.

A virtually universal practice in radio communication equipment has been to employ heterodyne frequency conversion in reception of radio signals, and in the generation of transmitting signals as well. Thus, except in the instances of simple amplitude modulated (AM) and continuous wave (CW) transmitters, variable frequency oscillators used therein operate at frequencies other than the output frequency of the transmitter. Moreover, it has become a recognized precept that greater isolation and resultant greater frequency stability accrue when a variable frequency oscillator is operated at a frequency other than output frequency of transmitting devices.

Heretofore, there has been no variable frequency oscillator available which combines the advantages of incremental fine tuning with a tuning range throughout the high frequency spectrum and with a digital frequency display having a preprogrammed offsetting count to provide a direct display of output frequency which is different from but related to actual operating frequency of the VFO.

SUMMARY OF THE INVENTION

An object of the present invention is to provide a variable frequency oscillator having a bandwidth covering the high frequency spectrum through a series of switchable ranges and which also includes incremental variable fine tuning.

Another object of the present invention is to provide a solid state variable frequency oscillator having a wideband push pull amplifier providing a substantial reduction of unwanted second harmonics.

A further object of the present invention is to provide a variable frequency oscillator with a digital display capable of being preset to a predetermined count to provide a numerical indication of a frequency differing from and integrally related to operating frequency of the variable frequency oscillator.

A still further object of the present invention is to provide a variable frequency oscillator which is characterized by simplicity and elegance of design, ease of programming and operation by the user, and low cost of construction with resultant frequency stability and high reliability over an extended useful life.

The variable frequency oscillator of the present invention accomplishes the foregoing objects by providing a radio frequency carrier signal in the high frequency spectrum which has a frequency grossly set by a band switch and coarse tuning control and finely tuned by an incremental fine tuning control. The VFO includes a broad band buffer circuit for isolating the output of the VFO and a broad band push pull output amplifier circuit for amplifying the generated carrier circuit to a desired predetermined amplitude and for cancelling unwanted even (particularly second) harmonics. The variable frequency oscillator includes a user programmable digital counter element which is connected to the output of the VFO to count the frequency thereof. The counter includes a stable reference locking circuit for generating a series of control signals from an internal frequency standard and providing the signals to gating and resetting control circuitry. The counter element includes a multiple stage programmable ripple counter which is connected to the gating and reset control circuitry and also having an input stage which is connected through the gating circuitry to the output of the variable frequency oscillator. A programming circuit is connected to the ripple counter for presetting into the stages of the counter a preset count. Connected to the ripple counter is a plural stage decoder for decoding each stage of the ripple counter into a digital indication. To each stage of the decoder is connected a digital display element for providing a visual indication of a decoded digit. The decoder stage may include latching circuitry to hold and display each final count of the ripple counter during the time interval when the ripple counter is recounting the VFO signal and adding the count reached to the number preset into the ripple counter.

Other objects, advantages and features of the invention will become apparent from the following detailed description of a preferred embodiment, presented with the accompanying drawings.

BRIEF DESCRIPTION OF THE DRAWINGS

FIG. 4 is a schematic diagram of the variable frequency oscillator circuit element of the unit shown in FIG. 1.

FIG. 5. is a schematic and block diagram of gating and reset control circuitry of the digital counter element of the unit of FIG. 1.

FIG. 7 is a schematic circuit diagram of the power supply of the circuit shown in FIG. 1.

DETAILED DESCRIPTION OF THE PREFERRED EMBODIMENT

Figure 1:
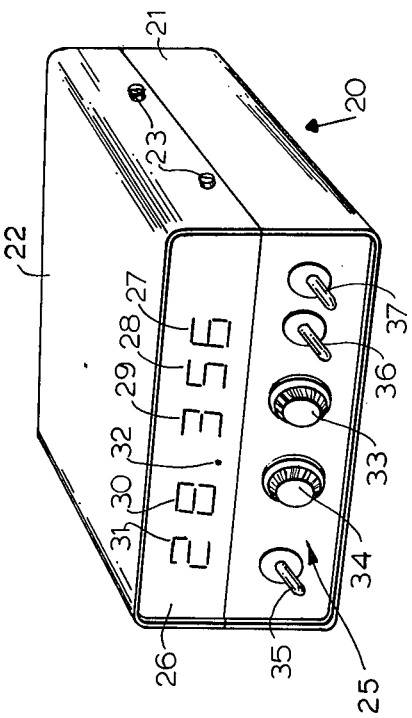
FIG. 1 is a front perspective view of a variable frequency oscillator having a progammable digital frequency display which is constructed in accordance with the principles of the present invention.
Figure 2:
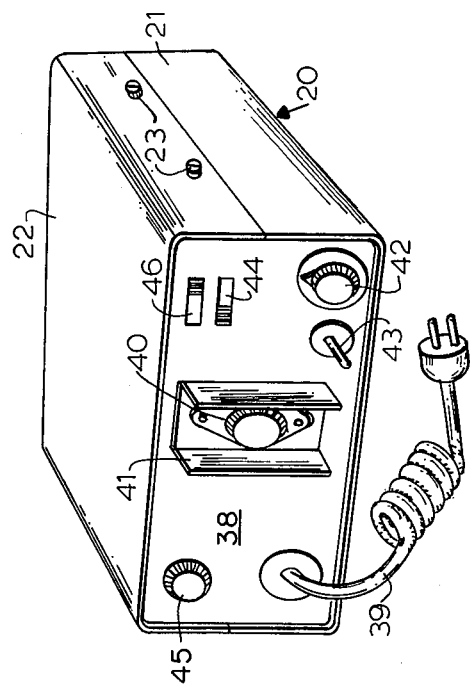
FIG. 2 is a rear perspective view of the unit shown in FIG. 1.

With reference to FIGS. 1 and 2 a variable frequency oscillator 20 is illustrated in accordance with the principles of the present invention. The oscillator system 20 is included within a metallic housing 21 having a removable top cover enabling access to the interior by removal of the screws.

The VFO system 20 includes a front panel 25 which provides a digital display 26 with five visible digits and a decimal point: a least significant digit 27, a next least significant digit 28, a middle digit 29, a next most significant digit 30 and a most significant digit 31. In the VPO system 20 shown in FIG. 1, a decimal point 32 appears between the digits 30 and 29 although it may be moved to a location between the digits 30 and 31 as will be explained hereinafter.

The front panel 25 also includes a gross tuning control 33 and a fine tuning control 34. The frequency may be roughly set by rotation of the control 33 and then finely tuned by rotation of the control 34 to the precisely desired operating frequency. A high-low tuning range toggle switch 35, a VFO standby switch 36 and a power on-off switch 37 are also provided on the front panel 25. The switches 35, 36, 37 are preferably miniature toggle switches.

The back of the unit 20 is shown in FIG. 2 as including a back panel 38, a line cord and plug 39, a solid state voltage regulator integrated circuit 40, and a heat sink having heat dissipating flanges 41. Also mounted on the back panel 38 are a band switch 42, a tuning shaft 43 for a slug tuned oscillator coil, a high frequency to very high frequency selector slide switch 44, an output jack 45 and finally a display range selector slide switch 46. The functions of each of these elements will be discussed hereinafter in connection with the circuit elements to which each is connected.

Figure 3:
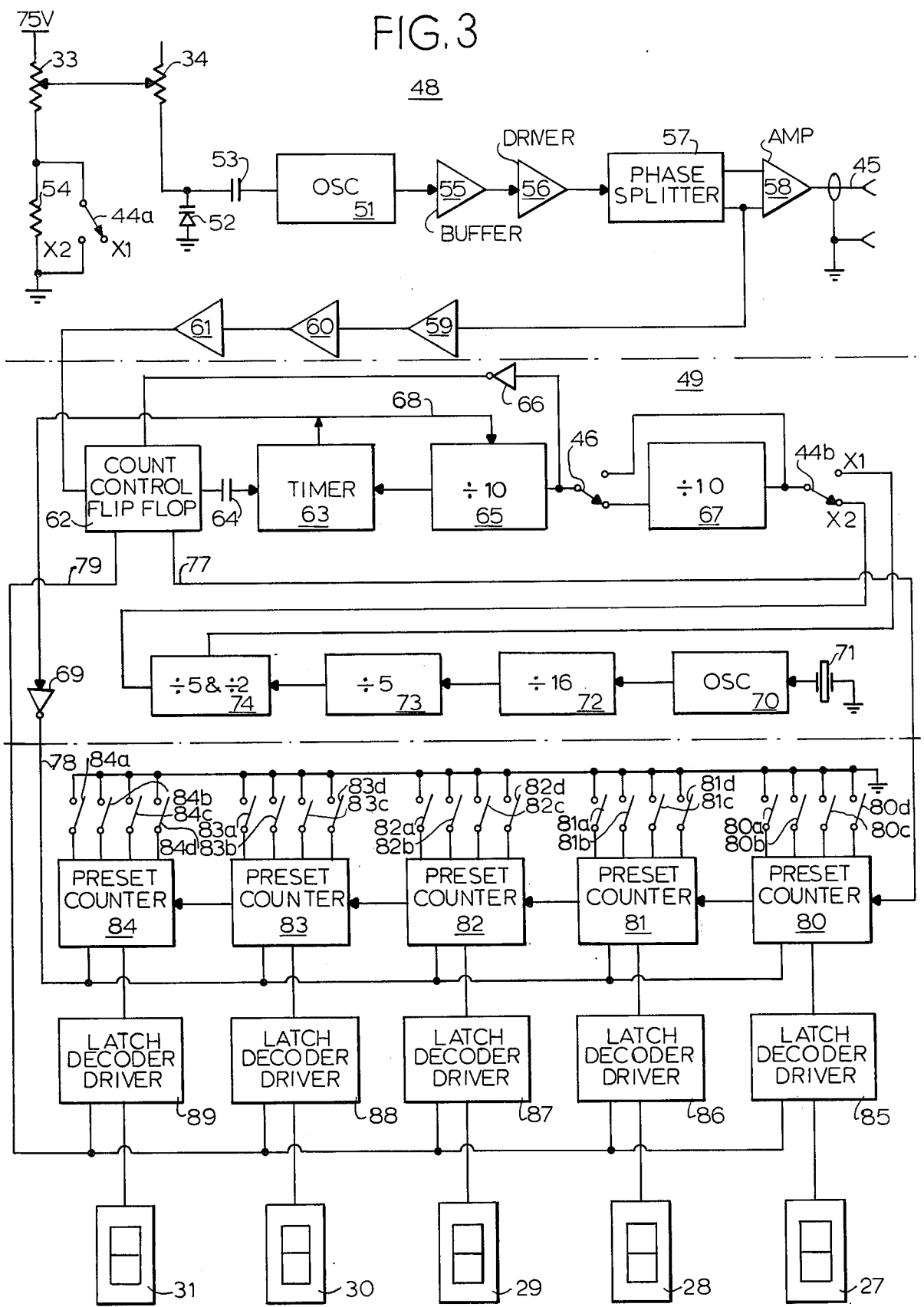
FIG. 3 is a block diagram of the VFO unit shown in FIG. 1.

Referring now to the simplified block diagram of the entire system 20, FIG. 3, it can be seen that the system 20 is divided into three sections: a variable frequency oscillator section 48, a display control logic section 49, and a display section 50.

The VFO section 48 includes an insulated gate field effect transistor oscillator 51 which includes in its resonant circuit a varactor diode 52 which is coupled to the oscillator through a DC blocking capacitor 53. The coarse tuning control 33 is connected between a positive regulated 15 volt supply bus 90 and a series biasing resistor 54 to ground. One set of contacts 44a of the range selector slide switch 44 shunts across the resistor 54 so that the tuning range of the tuning controls 33 and 34 is greater when the contacts 44a are closed. Opening the contacts 44a places the resistor 54 in series with the controls 33 and 34 and thereby diminishes their voltage range.

The wipers of the controls 33 and 34 are connected in common, with the fine tuning control 34 connected directly to the cathode of the varactor diode 52 and to the blocking capacitor 53. Details of the tuning circuitry for the oscillator 51 are described more particularly in connection with FIG. 4 hereinafter.

The radio frequency carrier signal generated by the oscillator 51 is sent to a buffer stage which is preferably implemented as an insulated gate field effect transistor buffer 55 (see FIG. 4). Output from the buffer 55 is provided as an input to a bipolar transistor driver stage 56, the output of which supplies a bipolar transistor phase splitter 57. There are two outputs of the phase splitter transistor 57: one from the collector and one from the emitter which are split in phase by 180°. These outputs are inputs to a push pull amplifier stage 58 which delivers an output having an impedance of 75 ohms to the output jack 45.

The collector output of the phase splitter transistor 57 also supplies a signal to a buffer transistor stage 59 which in turn drives a further transistor buffer stage 60 which is connected to a display driver stage 61. The display driver stage 61 provides a high level carrier output signal to a count control flip flop 62 of the display control logic section 49.

The display logic control section 49 additionally includes the count control flip flop 62 which receives an uninterrupted variable frequency oscillator carrier signal from the display driver 61. The flip flop 62 is preferably a TTL type 74H103 dual JK flip flop. Control pulses applied to the clocking input C2 and reset input R1 of the flip flop 62 (see FIG. 5) are used to gate precisely the carrier signal to the input stage 80 of the ripple counter in the display section 50. The display control logic section 49 further includes a type 555 timer 63 which receives control signals from the count control flip flop 62 through a differentiating capacitor 64. The timer stage 63 receives a clocking signal from a decade divider stage 65.

The clock input to the decade divider 65 is provided from the wiper of the switch contacts 46. The slide switch 46 provides a selection between display of megahertz and display of kilohertz by the visual digital display 26. Movement of the switch 46 between the two positions alters the position of the decimal point 32, from the point shown in FIG. 1 which corresponds to megahertz to a location between the digits 30 and 31 which corresponds to kilohertz. Clocking pulses at the output of the decade divider 65 are also applied through an inverter stage 66 to the Reset 2 input of the count control flip flop 62.

The display control logic section 49 also includes a divide by ten down counter element 67, the input of which is connected to a second set of contacts 44b of the slide switch 44.

The display control logic section 49 includes a crystal controlled clock oscillator 70, a TTL type 7400, having its frequency set by a piezoelectric crystal 71 with a resonant frequency of precisely 1 megahertz. Output from the oscillator 70 is provided as input to a divide by sixteen down counter 72, a TTL type 7493, which provides as its output a 62.5 kilohertz clock signal. A divide by five stage 73, a TTL type 7490, is connected to the divider 72 and provides as an output a 12.5 kilohertz signal. The 12.5 kilohertz signal is further divided by a divide by five counter 74, a TTL type 7490, to provide 2.5 kilohertz output which is applied as one of the stator contacts of the switch 44b. A divide by two output of the counter 74 provides the other stator contact of the switch 44b.

The timer 63, wired as a monostable multivibrator provides a control signal output on a bus 68 to the reset input of the decade divider 65 and to the ripple counter stages of the display section 50 through an inverter 69 via a reset bus 78. The count control flip flop 62 provides a latch strobe signal via a strobe bus 79 to the latch decoder driver elements of the display section 50, and the count control flip flop 62 also provides, via a count line 77, gated carrier signals generated by the oscillator 51 to the input stage 80 of the ripple counter in the display section 50.

The display section 50 includes a five stage tandem connected ripple counter including five programmable decade up counters, 80, 81, 82, 83 and 84. These counters are preferably TTL types 74192 or type 8290 made by Fairchild Semiconductor Corp. Each of the up counters 80 through 84 is provided with four manual programming switches A, B, C, D, so that a complementary binary count may be preset into each counter 80 through 84 by closing selected switch contacts A through D of each counter. In this way, each counter 80 through 84 may be preset to a number other than zero by a load signal received on the reset bus 78. Binary coded decimal output from the counters 80, 81, 82, 83 and 84 is applied as input to five latch and decoder-driver stages, 85, 86, 87, 88 and 89 respectively. The latch and decoder-driver stages 85 through 89 are provided with a latch signal via the bus 79 from the count control flip flop 62. Each of the latching decoder-driver stages 85 through 89 drives one of the visible digit displays 27, 28, 29, 30 and 31 respectively.

The details of the variable frequency oscillator section 48 of the system 20 are shown in the schematic circuit diagram of FIG. 4. The oscillator transistor 51 is shown to be a dual insulated gate field effect transistor, e.g. R.C.A. type 40823 with the gates thereof tied in parallel. The tapped inductor 43, 11.3 microhenrys, is connected between the gates through the capacitor 53 and the drain of the transistor 51. The bandswitch 42 is shown to be switchable between multiple taps of the coil 43. As previously noted, the transistor 51 operates as a modified Colpitts oscillator, with shunt capacitors including the varactor diode 52, type MV1628 connected from the common node of the coil 43 and capacitor 53 to ground. Those capacitors include a high-low range shunt capacitor 101 which is connected to ground by the high-low range toggle switch 35. A varactor isolation capacitor 102 is connected in series with the varactor 52 and the node 100. A third shunt capacitor 103 is also connected from the node 100 to ground to provide a minimum capacitance when the capacitors 102 and 52 are not effectively in the circuit. At a node 104 between the capacitor 102 and the varactor 52, a series resistor 105 is connected.

The resistor 105 is connected at its other end to a node 106 which includes a high frequency bypass capacitor 107 and a low frequency bypass capacitor 108 connected to ground. Also connected to the node 106 is a series resistor 109 which is connected to a fixed terminal end of the fine tuning control 34 and also to a series resistor 110 connected to ground. As already mentioned in connection with FIG. 3, the wiper of the fine tuning control 34 is connected to the wiper of the coarse tuning control 35. One fixed contact of the coarse tuning control 33 is connected to the plus fifteen volt supply bus 90, and the other fixed terminal thereof is connected to a series resistor 111 which in turn is connected to a node 112 to which the wiper of the switch contacts 44a and the resistor 54 are connected. The coarse control 33 may be a ten turn ten kilohm potentiometer and the fine control 34 may be a ten turn one kilohm potentiometer, preferably types LM2876 and LM4291, made by CPS of Brownsville, Brownsville, Texas.

It should be noted in connection with the high-low range switch 35 that a shielded cable 113 leads from the switch 35 to the capacitor 101 so as to maintain a fixed value of capacitance with vibrations or thermal stresses. The paralleled insulated gates of the transistor 51 are shunted to ground with high value resistor 114. The source of the transistor 51 is grounded and the drain of the transistor 51 is connected through a load resistor 115 to the plus five volt supply bus 91. The resonant circuit of the oscillator 51 is completed by two capacitors 116 and 117 shunted from the drain to ground. The capacitor 116 is a zero temperature coefficient type whereas the capacitor 117 has a negative coefficient to offset losses due to thermal heating within the transistor 51 and within the coil 43.

The radio frequency carrier signal generated by the oscillator 51 is passed through an isolation capacitor 118 to a first gate of the insulated buffer transistor 55, preferably RCA type 40823. The first gate also includes a high value shunt resistor 119 to ground. A second gate of the transistor 55 includes a resistor 120 to ground and a resistor 121 to the plus five volt supply bus 91. The drain of the transistor 55 is directly connected to the plus five volt supply bus 91, and the source of the transistor 55 is connected to ground through a low value resistor 122.

The transistor 55 is wired as a common drain amplifier, and its output is taken from the source through a resistor 123 and capacitor 124.

The capacitor 124 is connected to a node 125 to which the base of the bipolar transistor driver 56 is also connected. A bias resistor 126 is connected from ground to the node 125, and a bias resistor 127 is connected from a node 128 to the node 125. The collector of the transistor 56 is directly connected to the node 128. The emitter of the transistor 56 is connected to the base of the phase splitter transistor 57 and also to ground through a bias resistor 129.

The collector of the phase splitter transistor 57 is connected through a resistor 130 to the node 128, and through a capacitor 131 to a node 132 to which the base of the display buffer transistor 59 is also connected. The collector of the transistor 57 is connected through a second capacitor 133 to the base of a transistor 134 comprising one half of the bipolar push pull output amplifier stage 58.

The emitter of the phase splitter transistor 57 is connected to ground through a resistor 135 which is equal in value with the resistor 130. A drive signal is taken from the emitter of the transistor 57 through a capacitor 136 to the base of a transistor 137 which comprises the other half of the push pull output stage 58.

The base circuit node 132 of the diplay buffer transistor 59 is connected to ground through a bias resistor 138 and to the node 128 through a bias resistor 139. The emitter of the transistor 59 is grounded, and the collector is connected to the node 128 through a load resistor 140. The display signal provided at the collector of the transistor 59 is passed through a blocking capacitor 141 and sent to the buffer amplifier 60 (shown schematically in FIG. 5).

A bias resistor 142 is connected between the base of the transistor 134 and a node 143, and a bias resistor 144 is connected from the base of the transistor 137 to the node 143. Also connected to the node 143 is a resistor 145 from the node 128 and a resistor 146 from ground.

The node 128 is connected through a low value dropping resistor 147 to the plus five volt supply bus 91. The collectors of the transistors 134 and 137 are connected together through a resistor 148 and through a center tapped primary winding of a broadband toroidal inductor 149. The center tap of the inductor 149 is also connected to the plus five volt supply bus 91. A secondary of the inductor 149 is connected between ground and the output jack 45. The emitters of the transistors 134 and 137 are connected together, and to ground, through a resistor 150.

The bipolar transistors 56, 57, 59 and the push pull stage 58 are all preferably implemented with an RCA type CA 3046 transistor array integrated circuit.

Three capacitors, 150a, 151 and 152, bypass the plus five volt supply bus 91 to ground over the frequency range from direct current through VHF. A high frequency bypass capacitor 153 bypasses the voltage supply node 128 to ground.

The display control logic section 49 is detailed in FIG. 5. The display signal from the display buffer 59 (FIG. 4) is sent through a coaxial cable 161 to a series network including a resistor 162 and capacitor 163 to reach the base node 164 of the bipolar display buffer transistor 60. A bias resistor 165 is connected from the node 164 to ground, and a bias resistor 166 is connected from the node 164 to the plus five volt bus 91. The emitter of the transistor 60 is grounded, and the collector is connected to the plus five volt bus 91 through a load resistor 167.

Output from the buffer stage 60 is taken from the collector of the transistor 60 through a coupling capacitor 168 to a base node 169 of the display driver amplifier 61. A bias resistor 170 is connected from ground to the node 169, and a bias resistor 171 is connected from the five volt bus 91 to the node 169. The emitter of the transistor 61 is grounded, and the collector is connected to the five volt bus 91 through a load resistor 172. The collector of the transistor 61 is connected via a line 173 to the clock one (C1) input of the count control gate flip flop 62.

The display control logic section 49 includes a clock chain comprising the oscillator 70. The crystal 71 may be connected from pin 3 to pin 10 of the oscillator 70 through a blocking capacitor 181. Bias resistor 182 is connected from pin 10 to a node 183 to which pins 2, 5 and 8 of the oscillator chip 70 are connected. Also connected to the node 183 are a resistor 184 and a capacitor 185, both also being connected to the plus five volt bus 91. Pins 1, 4, 9 and 14 of the oscillator chip 70 are connected to the five volt bus 91, and pin 7 of chip 70 is grounded. Output from the chip is taken at pin 6 via a lead 186 to pin 1 of the divide by sixteen down counter 72. The counter 72, implemented as a TTL type 7493, has pins 10, 2 and 3 grounded, pin 5 connected to the plus five volt bus 91 and pins 11 and 14 connected together via a wire 187. Output from the down counter 72 is taken from pin 12 via a lead 188 to pin 1 of the divide by five down counter 73. Pins 10, 2, 3, 6 and 7 of the counter 73, a TTL type 7490, would be grounded, pin 5 would be connected to the plus five volt bus 91, and pin 11 would be connected via a lead 189 to a pin 1 of the down counter 74, which also is implemented as TTL type 7490. In the counter 74, pins 10, 2, 3, 6 and 7 would be grounded, pin 5 would be connected to a plus five volt bus 91 and pin 11 would be connected to pin 14 and to the times one (x1) position of the switch contacts 44b via a wire 190. The times two (x2) position of the switch contacts 44b would be connected via a wire 191 to the output pin 12 of the down counter 74.

The wiper contact of the switch set 44b would be connected via a wire 192 to pin 1 of the divide by ten down counter 67 and would also be connected to the megahertz (MHz) contact of the display range selector switch 46. Pins 10, 2, 3, 6 and 7 of the down counter 67 would be grounded, pin 5 would be connected to the plus five volt bus 91, and pin 11 would be connected to pin 14 via a wire 193. The output of the counter 67 would be taken from pin 12 via a wire 194 to the kilohertz (KHz) position of the display range selector switch 46. The wiper contact of the switch 46 would be connected to pin 1 of the divide by ten down counter 65 wherein pins 10, 6 and 7 would be grounded and pin 5 would be connected to the plus five volt bus. Pin 11 would be connected to pin 14 via a wire 196 and the output would be taken from pin 12 via a wire 197 to the clock two and reset one inputs of the count control gate and flip flop 62.

The Q2 output of the count control gate and flip flop 62 would be taken through a differentiating capacitor 64 to a node 198 to which a resistor 199 is connected from ground and a resistor 200 is connected from the plus five volt bus 91.

The monostable multivibrator time 63 is preferably implemented as a type 555 timer integrated circuit available from a variety of manufacturers. Pin 2 of the one shot 63 would be connected to the node 198, pin 1 would be connected to ground directly and pin 5 would be connected to a ground through a bypass capacitor. Pins 4 and 8 would be connected to the plus five volt bus 91. The time constant of the multivibrator 63 would be fixed by a capacitor 201 from ground to a node 202 to which pins 6 and 7 of the chip 63 are connected. Also connected to node 202 is a timing resistor 203 from the plus five volt bus 91. Output from the multivibrator 63 is taken from pin 3 through the wire 68 to a reset input pin 2 of the decade down counter 65 and also through the inverter 69 to provide the reset bus 78.

The wiper of the switch 46 is also connected via the wire 195 through the inverter 66 to the reset two input of the count control gate and flip flop chip 62. The inverters 66 and 69 may be implemented with a single TTL chip such as the type 7400, in which event input to the inverter 66 would be via pin 12 and output via pin 11, and input to inverter 69 would be via pin 10 and output via pin 8. Pins 1, 2, 4, 5, 9, 13 and 14 would be connected to the plus five volt bus 91, and pin 7 would be grounded.

The Q1 output of the count control gate flip flop 62 provides the count lines 77 and the Q2 output of the count control gate flip flop 62 provides the latch strobe line 79.

Figure 6:
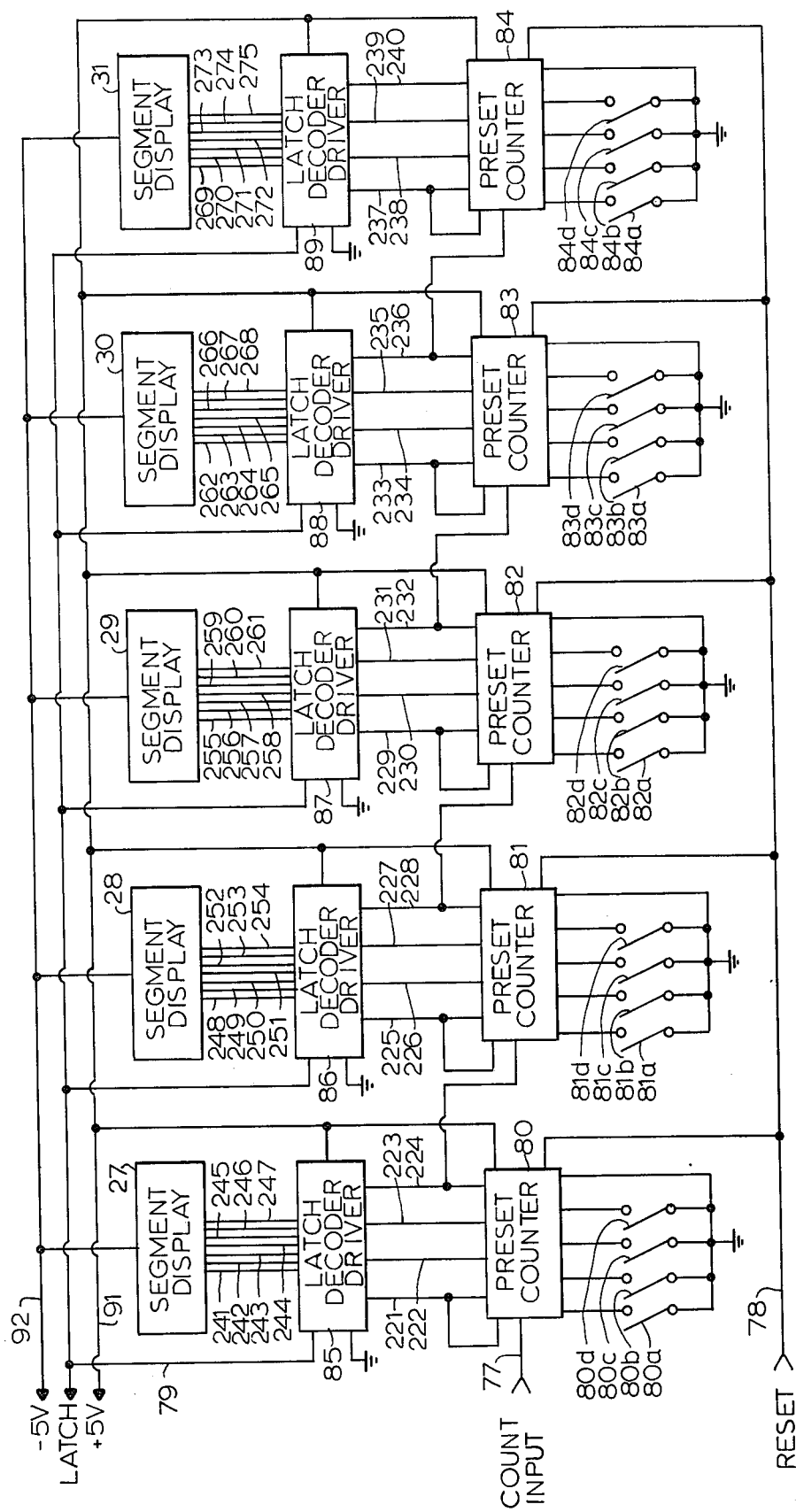
FIG. 6 is a schematic circuit diagram of the ripple counter and display elements of the unit shown in FIG. 1.

The display section 50 is shown schematically in FIG. 6. The programmable counters 80, 81, 82, 83 and 84 are shown as TTL type 74196 manufactured by Texas Instrument, National Semiconductor, etc. As previously mentioned in FIG. 3, each counter 80 through 84 includes four data switches: 80a, 80b, 80c and 80d for counter 80; 81a, b, c and d for counter 81; 82a, b, c and d for counter 82; 83a, b, c and d for counter 83; and 84a, b, c and d for counter 84. The switches are connected from ground to the data inputs a, b, c and d (pins 4, 10, 3 and 11) of the counters 80 through 84. The gated count signal is input from the count line 77 to the clock one input (pin 8) of the counter 80. The binary coded decimal (BCD) output of the counter chip 80 is sent through the latch and decoder chip 85 via four data lines 221, 222, 223, and 224. The line 221 interconnects pins 5 and 6 of the counter 80 to pin 7 of the latch 85. The line 222 connects pin 9 of the counter 80 to pin 1 of the latch 85. The line 223 connects pin 2 of the counter 80 with pin 2 of the latch 85, and the line 224 connects from pin 12 of the counter 80 to pin 6 of the latch 85 and also to the input pin 8 of the next counter 81. Pins 7 of the counter chips 80 through 84 are grounded, and pins 14 of those chips are connected to the plus five volt supply bus 91. Connections for the counters 81 through 84 are the same as for the counter 80, with BCD data lines 225, 226, 227, 228 interconnecting the counter 81 with the latch 86. Data lines 229, 230, 231 and 232 interconnect the counter 82 with the latch 87. Data lines 233, 234, 235 and 236 interconnect the counter 83 with the latch 88, and data lines 237, 238, 239 and 240 interconnect the counter 84 with the latch 89. Line 228 connects the high order output of the counter 81 with the count input of the counter 82. Line 232 connects the high order output of the counter 82 with the count input of the counter 83, and line 236 connects the high order output with the input of the count 84. The reset bus 78 is connected in parallel to pins 1 of the counters 80 through 84.

The latch-decoder-seven segment driver circuits 85, 86, 87, 88 and 89 are preferably TTL type 9374 manufactured by Fairchild Semiconductor Corporation, Mountain View, California. The latch strobe bus 79 is connected to the latch strobe input at pin 3 of the circuits 85 through 89. Data is received from the counters 80 through 84 at pins 7, 1, 2 and 6, as shown in the drawing. Decoded seven segment decimal output information is provided from each decoder 85 through 89 to its corresponding display 27–31, respectively. The decoder 85 is connected to the display 27 via lines 241, 242, 243, 244, 245, 246 and 247. The decoder 86 is connected to the display 28 via lines 248, 249, 250, 251, 252, 253 and 254. The decoder 87 is connected to the display 29 via lines 255, 256, 257, 258, 259, 260 and 261. The decoder 88 is connected to the display 30 via lines 262, 263, 264, 265, 266, 267 and 268; and, the decoder 89 is connected to the display 31 via lines 269, 270, 271, 272, 273, 274, 275.

The display elements are type FND-507, manufactured by Fairchild Semiconductor Corp. In each case, each display is connected to each decoder by having a pin 13 of the decoder connected to pin 7 of the display, pin 12 of the decoder to pin 6 of the display, pin 11 of the decoder to pin 4 of the display, pin 10 of the decoder to pin 2 of the display, pin 9 of the decoder to pin 1 of the display, pin 13 of the decoder to pin 8 of the display, and pin 14 of the decoder to pin 10 of the display. The pins 16 of the decoder 85 through 89 are connected to the plus five volt supply bus 91, and the pins 8 of the decoders 85 through 89 are grounded. The displays 27 through 31 are connected at pins 3 and 8 thereof to a minus five volt supply bus 92.

A power supply 301 suitable for powering the system 20 is shown schematically in FIG. 7. Therein the line cord 39 is connected in series with the on-off power switch 37 and a primary winding of a transformer 302 and a fuse 303. A bypass capacitor 304 is across the primary and a second bypass capacitor 305 is connected from the primary winding to the chassis 318. The capacitors 304 and 305 bypass radio frequency and extraneous signals to ground. A first secondary winding of the transistor 302 is connected through a diode 306 and a parallel capacitor 307 to provide the plus fifteen volt supply bus 90.

A second secondary of the transformer 302 is connected to a bridge circuit 308. A plus output line 309 of the bridge 308 is connected to a plus five volt regulator 310. Output of the regulator 310 provides the plus five volt supply bus 91. A bypass capacitor 311 is connected from the line 309 to ground, and a bypass capacitor 312 is connected from the plus five volt supply bus 91 to ground. A negative output line 313 from the bridge 308 is taken to return of plus five volt regulator 314. The power supply utilizes a floating ground with a high frequency bypass capacitor 315 and a low frequency bypass capacitor 316 connected between circuit ground 317 and the chassis 318.

Figure 8:
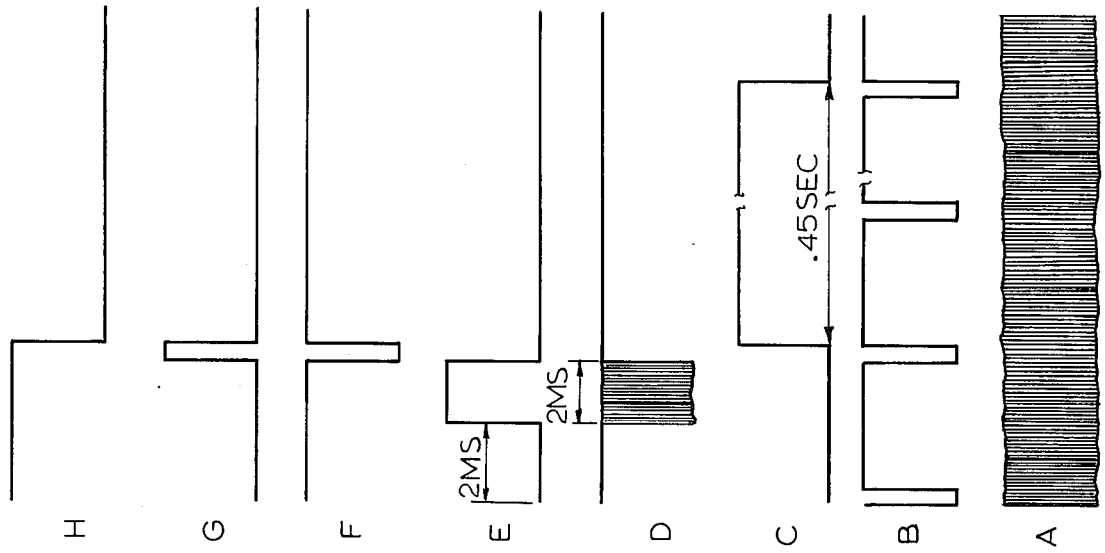
FIG. 8 is a timing diagram of the gating and reset control circuitry shown schematically in FIG. 5.

The waveform diagrams of FIG. 8 illustrate the operation of the display control logic section 49. An uninterrupted radio frequency carrier signal having a predetermined constant amplitude is shown as waveform A. This carrier signal is found on line 173 which interconnects the collector of the output transistor 61 to the clocking 1 (C1) input of the count control gate and flip flop 62.

Waveform B illustrates negative going periodic pulses of short duration which are supplied from the switchable sliding contact of the range slide switch 46 through the inverter 66 to the reset 2 (R2) input of the count control gate and flip flop 62. The period of the pulses shown in waveform B is dependent upon the setting of the slide switch 46 as well as the setting of the multiplier switch 44. In FIG. 8, the period of these pulses of waveform B is four millisecond.

The output of the decade counter 65 applied to the clock 2 (C2) and reset 1 (R1) inputs of the count control gate and flip flop 62 provides the waveform shown in FIG. E. This waveform enables the count control gate and flip flop to gate a predetermined period of uncounted carrier to the input stage 80 of the counter chain. The signal appearing on the count line 77, being the $\overline{Q1}$ output of the count control gate and flip flop 62, is illustrated as waveform D. The signal shown as waveform E also provides the signals shown as waveform F and waveform G. Waveform F is the downward going impulse provided at the $\overline{Q2}$ output of the count control gate and flip flop 62 as the latch strobe bus 79. Waveform G is the inverse of waveform F and represents the Q2 output of the count control gate and flip flop 62 which is supplied through the timing capacitor 64 to the input of the timer stage 63.

In response to the signal illustrated by waveform G, the timer stage 63 provides an output signal illustrated as waveform C. In accordance with the value of the timing capacitor 64 and the associated timing resistor 199 and 200, the timer 63 provides a high level control signal of predetermined period. As illustrated in waveform C, the duration of the high level signal from the timer is 0.45 second. This timing signal from the timer 63 is taken via the bus 68 through an inverter 69 to provide the reset bus 78 with a reset signal (waveform H) which resets the counters 80, 81, 82, 83 and 84 which make up the ripple counter chain. The output from the timer 63 via the bus 68 is also supplied to a reset input of the decade divider 65 to inhibit its output during the duration of the high level pulse from the timer 63. The reset input of the decade divider 65 is such that when a high level signal is applied thereto, all of the outputs thereof are forced to a low state and no counting occurs.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A self-contained high frequency range variable frequency oscillator system for connection to a user's high frequency radio set regardless of its design and capable of functioning in lieu of a local oscillator in said set, said system comprising:

high frequency oscillator means for generating a radio signal at a primary frequency variable within a range in the high frequency spectrum;

frequency variation means connected to said high frequency oscillator means for enabling the user to vary the primary frequency thereof;

output buffer means connected to said oscillator means and to said radio set for isolating said oscillator means from said radio set;

time base generator means for generating a control signal providing a predetermined recurrent counting interval wherein said time base generator means provides a plurality of different predetermined recurrent counting intervals and includes a frequency standard oscillator;

a frequency divider chain of plural stages connected at its input to said standard oscillator and having a plurality of outputs to provide said intervals, each output being a quotient of the frequency of said standard oscillator;

master slave flip flop means having a master flip flop clocking input connected to said output buffer means for receiving said variable high frequency signal, a reset input connected to a selected output of said divider chain, and an inverting output connected to said programmable digital counter means to provide said recurrent counting interval thereto;

said master slave flip flop means having a slave flip flop clocking input connected to said reset input of said master flip flop, a reset input connected to one of said plural stages of said frequency divider chain, a non-inverting output connected to a resistance-capicitance timing circuit, and an inverting output connected to said digital display means for latching the total count reached by said digital counter during a display interval;

monostable multivibrator means having an input connected to said resistance-capacitance timing circuit and an output connected to said frequency divider chain to disable said output quotient during said display interval and to said programmable digital counter means for resetting said counter at the beginning of said display interval; and count range selector switch means connected to said time base generator means for selecting between said different intervals;

presettable digital counter means connected to said output buffer means and to said time base generator means for recounting the number of oscillations of said radio signal occurring during each said counting interval, and having an output;

manual set switch means connected to said digital counter means for enabling the user to preset a fixed count into said digital counter means, said fixed count being a function of the difference between the frequency at which said set is operating and the frequency of said radio signal;

digital display means connected to said time base generator means and to the output of said digital counter means for displayin the frequency to which said radio set is tuned, whereby the user may connect said system to an unlimited variety of high frequency radio sets having vastly different offsets between local oscillator frequency and operating frequency and still obtain a display of virtual operating frequency of the set by presetting said digital counter means with the fixed count appropriate to the particular set to which said system is connected.

2. The system set forth in claim 1 wherein said frequency variation means comprises:

varactor diode means connected to said high frequency oscillator means for varying the frequency of said radio signal in accordance with voltage variations thereacross; and manually operable voltage variation means connected to a voltage supply and to said varactor diode means for varying the voltage thereacross.

3. The system set forth in claim 2 wherein said manually operable voltage variation means comprises:

coarse voltage variation means for providing said varactor diode means with a first control voltage variable over the range of operation of said varactor diode means; and vernier voltage variation means for providing said varactor diode means with a second control voltage variable over a fractional increment of said range of operation with a midpoint of said increment being determined by the setting of said coarse voltage variation means.

4. The system set forth in claim 1 wherein said frequency variation means includes a tapped inductor in said high frequency oscillator means and a switch connected to taps of said inductor for varying the frequency of said oscillator means.

5. The system set forth in claim 1 additionally comprising bandswitch means connected to said high frequency oscillator means for switching between plural ranges in the high frequency spectrum.

6. The system set forth in claim 1 additionally comprising switchable fixed offset means connected to said high frequency oscillator means for offsetting the frequency of oscillations thereof by a predetermined amount.

7. The system set forth in claim 1 additionally comprising latch means connected between said digital counter means and said digital display means for latching said number of oscillations between successive counts of said counter means.

8. The system set forth in claim 1 wherein said output buffer means includes a push pull output amplifier element.

9. The system set forth in claim 8 wherein said push pull output amplifier element includes transistors formed on a single monolithic integrated circuit substrate.

10. The system set forth in claim 1 wherein said time base generator means includes a plurality of outputs and user operable switch means connected thereto for enabling said control signal to be divided by selection of a said output with resultant multiplication in the period of said recurrent counting interval whereby the digital display of virtual operating frequency may thereby be multiplied.

* * * * *